(12) United States Patent
Hurley

(10) Patent No.: US 7,091,087 B2
(45) Date of Patent: Aug. 15, 2006

(54) OPTIMIZED FLASH MEMORY CELL

(75) Inventor: Kelly T. Hurley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 10/787,335

(22) Filed: Feb. 26, 2004

(65) Prior Publication Data

US 2004/0166631 A1 Aug. 26, 2004

Related U.S. Application Data

(63) Continuation of application No. 09/905,517, filed on Jul. 13, 2001, now Pat. No. 6,706,594.

(51) Int. Cl.
 *H01L 21/336* (2006.01)
(52) U.S. Cl. ............... 438/257; 438/653; 438/656; 438/639; 438/672; 438/740
(58) Field of Classification Search ............... 438/258, 438/259, 593, 652, 653, 656, 257, 639, 672, 438/740
See application file for complete search history.

(56) References Cited

U.S. PATENT DOCUMENTS

| | | | |
|---|---|---|---|
| 5,210,047 A | 5/1993 | Woo et al. | 437/43 |
| 5,731,242 A | 3/1998 | Parat et al. | 438/586 |
| 5,994,733 A * | 11/1999 | Nishioka et al. | 257/316 |
| 6,080,624 A | 6/2000 | Kamiya et al. | 438/257 |
| 6,188,115 B1 | 2/2001 | Kamitani | 257/412 |
| 6,271,087 B1 | 8/2001 | Kinoshita et al. | 438/258 |
| 2004/0079985 A1* | 4/2004 | Yonehama et al. | 257/315 |
| 2005/0023600 A1* | 2/2005 | Shin et al. | 257/315 |

OTHER PUBLICATIONS

"A 130-mm2, 256-Mbit NAND Flash with Shallow Trench Isolation Technology", Kenichi Imamiya et al., IEEE Journal of Solid-State Circuits, vol. 34, No. 11, Nov. 1999.

"Novel 0.44 μm2 Ti-Salicide STI Cell Technology for High Density NOR Flash Memories and High Performance Embedded Application", H. Watanabe et al., IEDM 98, pp. 975-978.

* cited by examiner

*Primary Examiner*—Mary Wilczewski
*Assistant Examiner*—Toniae M. Thomas
(74) *Attorney, Agent, or Firm*—David J. Paul

(57) ABSTRACT

A flash memory comprising floating gate devices being connected to one-another through their source electrodes being self-aligned to their respective gate electrodes, a local tungsten interconnect making a substantially continuous connection to the sources. The flash memory is formed by forming floating gate devices, each comprising a floating gate, forming a source electrode for each floating gate device and connecting each source electrode together by a conductive implant into a defined active area, forming a nitride barrier layer overlying each transistor gate, forming a planarized insulation layer over the nitride barrier layer, removing portions of the planarized insulation layer while using the nitride barrier layer to self-align an interconnect via opening to the source electrodes, forming a metal interconnect into the interconnect via, the metal interconnect running a major length of the interconnected source electrodes and making contact therebetween, and forming a metal drain plug for each floating gate device.

6 Claims, 6 Drawing Sheets

OPTIMIZED FLASH MEMORY CELL

This application is a continuation to U.S. patent application Ser. No. 09/905,517, filed Jul. 13, 2001 now U.S. Pat. No. 6,706,594.

FIELD OF THE INVENTION

This invention relates to semiconductor fabrication processing and, more particularly, to a fabrication method for forming storage cells in semiconductor devices, such as non-volatile flash memory devices.

BACKGROUND OF THE INVENTION

Non-volatile semiconductor memory devices are currently used extensively through the electronics industry. One type of non-volatile semiconductor memory devices employs the use of floating gate memory cells that are able to retain and transfer charge through a variety of mechanisms which include avalanche injection, channel injection, tunneling, etc. A flash memory device is such a semiconductor device that utilizes a floating gate memory cell. As is the case with most semiconductors being fabricated, the industry continues to push for smaller devices that contain a larger number of memory cells than each previous generation. This is also the case for the flash memory device.

In a flash memory device, fabrication of the components that make up the floating gate transistor determines the ability of the device to be programmed and retain an electrical charge as well as the ability of the device to be reprogrammed by being erased (or the removal of the electrical charge). Flash memory cells comprising floating gate transistors are laid out in such a manner that a plurality of cells forms a memory array.

A device in the programmed state, i.e., charge stored on the floating gate, represents a stored "0" and a device in the non-programmed state, i.e., no charge stored on the floating gate, represents a stored "1." Reading a device in the programmed state will cause the device to conduct heavily, while reading a device in the non-programmed state the device will not conduct. Each floating gate transistor in the array has a common source line and the common source line requires sophisticated fabrication techniques.

The present invention provides a flash memory cell structure and method to fabricate a floating gate device having a self-aligned floating gate, a low resistant local interconnect to the source and a self-aligned drain electrode contact plug, all of which will provide enhanced operation of a flash memory cell device.

SUMMARY OF THE INVENTION

Exemplary implementations of the present invention include a flash memory device and processes to fabricate a flash memory device.

A first exemplary implementation of the present invention includes a flash memory device comprising a series of floating gate devices each having a floating gate self-aligned to a respective transistor gate electrode. The sources for each transistor gate are implanted so that they are interconnected by a common conductively doped active area. A metal interconnect runs a major length of interconnected source electrodes and makes substantially continuous contact therebetween. The metal interconnect may comprise a tungsten-based metal, such as tungsten/titanium. A metal self-aligned drain connecting to a respective drain may be comprised of tungsten/titanium as well.

A second exemplary implementation of the present invention includes process steps for forming a flash memory device on a semiconductor assembly by forming a series of floating gate devices, each having floating gate electrodes self-aligned to their respective transistor gate electrode. Implanted source electrodes connected together by a conductively doped active area are formed. Then, a nitride barrier layer is formed such that it overlies each transistor gate. Next, a planarized insulation layer is formed over the nitride barrier layer. Portions of the planarized insulation layer are removed while using the nitride barrier layer to self-align an interconnect via to underlying source electrodes.

Next, a metal local interconnect is formed into the interconnect via. The metal interconnect runs the major length of the source electrodes, while making contact therebetween. It is optional to simultaneously form metal drain plugs for each floating gate device and self-aligning each metal drain plug to an underlying drain electrode. The metal interconnect and the metal drain plug may be formed from a tungsten-based metal, such as tungsten/titanium.

DETAILED DESCRIPTION OF THE INVENTION

Exemplary implementations of the present invention directed to processes for fabricating a floating gate memory device are depicted in FIGS. 1–10.

Figure 1:
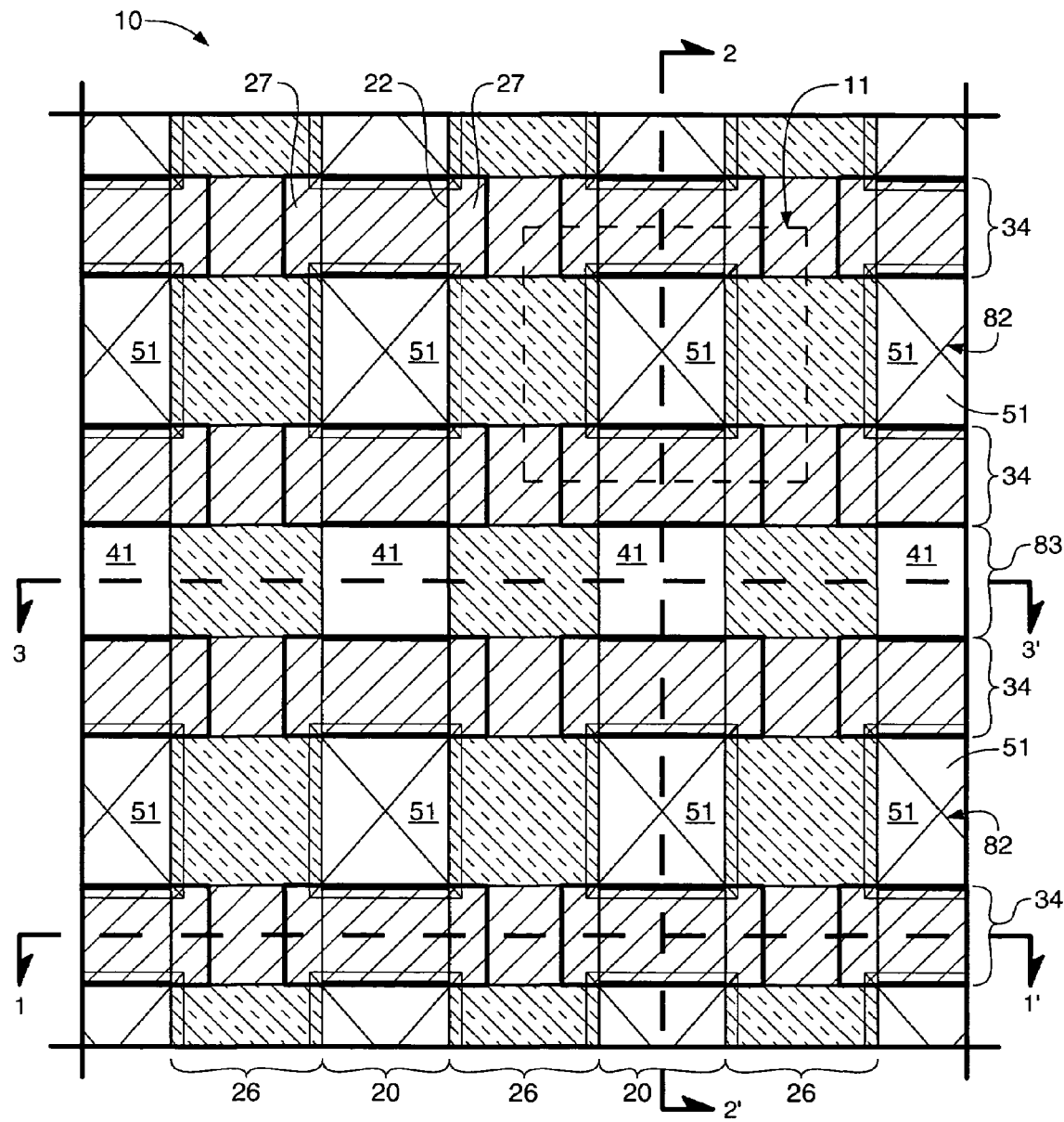
FIG. 1 is a top-down view depicting the layout of an array of flash cells, each cell utilizing a self-aligned floating gate, tungsten/titanium local interconnect and a self-aligned drain electrode contact plug.

Referring now to the top-down view of FIG. 1, a layout of an optimized flash cell on wafer substrate 10, is presented. A single flash cell is outlined by box 11 and is depicted in the subsequent cross-sectional views taken through the active areas 20 that define the location of the source, drain and channel of the floating gate devices to be formed. Shallow trench isolation 25 provides isolation between neighboring gate devices. Wordlines 34 run horizontally and overlie the self-aligned floating gates 22. Self-aligned floating gates 22 span between self-aligned sources and drains that reside in the confines of active areas 20. Self-aligned drain contacts 82 make contact to underlying drains 51 and tungsten local interconnects 83 make contact to underlying self-aligned sources 41.

Figure 2A:
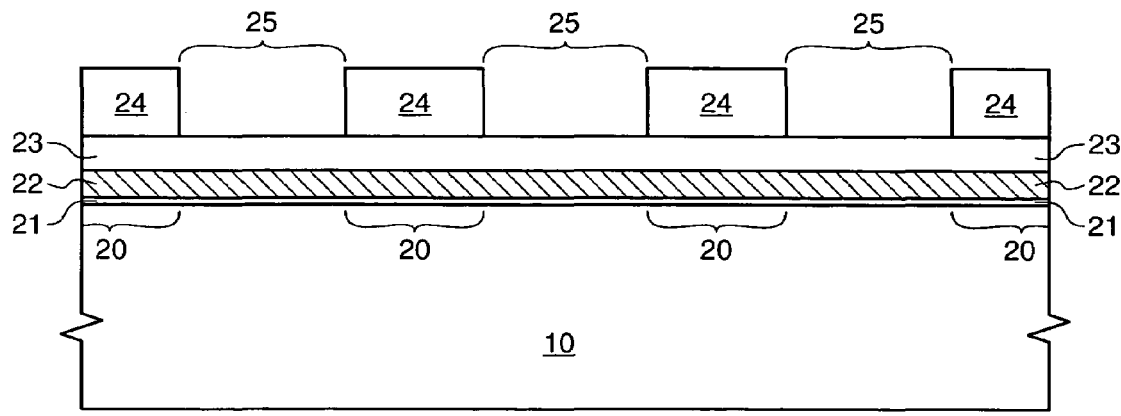
FIGS. 2A–2C are cross-sectional views taken through line 1–1' of FIG. 1 after the formation of shallow trench isolation and self-aligned floating gates.
Figure 2B:
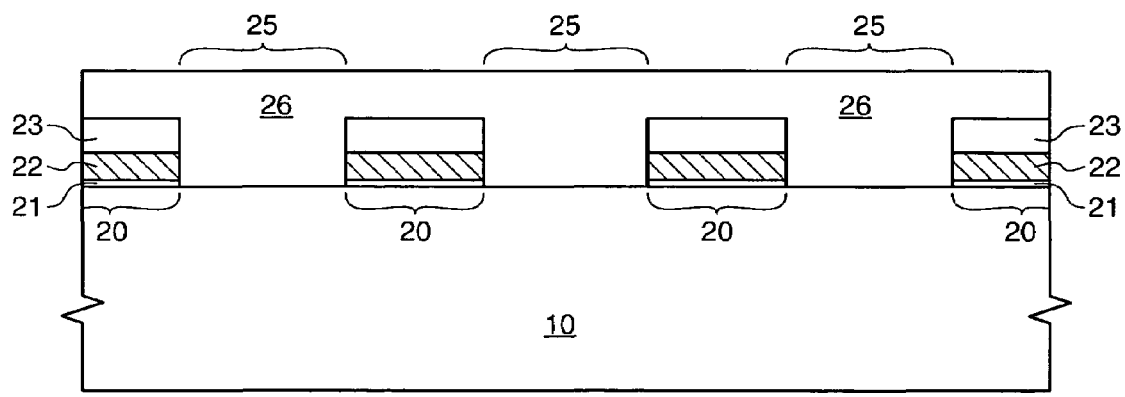
Figure 2C:
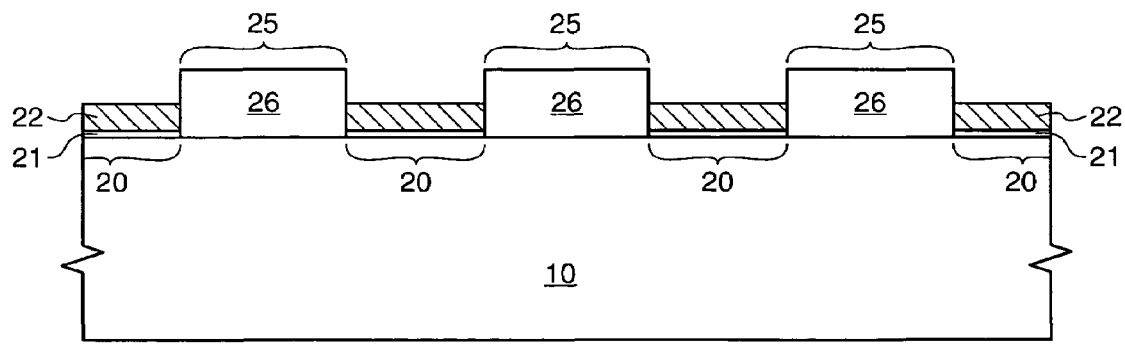

FIGS. 2A–2C are cross-sectional views of FIG. 1 taken through line 1–1'. Referring now to FIG. 2A, Oxide layer 21, polysilicon layer 22 and nitride layer 23 are formed on substrate 10. Material 24, such as photoresist, is formed to provide a pattern for a subsequent self-aligned floating gate etch and to define active areas 20 and isolation trenches 25.

Referring now to FIG. 2B an etch is performed to create isolation trenches 25 as well as self-aligned floating gates 22, with patterned gate oxide 21 lying underneath. Patterned nitride 23 overlies self-aligned floating gate 22. Isolation oxide 26 is formed to fill isolation trenches 25, as well as cover the self-aligned source stack of nitride 23, self-aligned source polysilicon 22 and gate oxide 21.

Referring now to FIG. 2C, isolation oxide 26 is planarized followed by the removal of patterned nitride 23 (seen in FIG. 2B) to form patterned shallow trench isolation 26 and also to define active areas 20. In this process, floating gate 22 becomes self-aligned to the transistor gate by virtue of being etched during the shallow trench isolation etch. Optional floating gate wings 27 (seen in overhead view of FIG. 1) may also be included.

Figure 3:
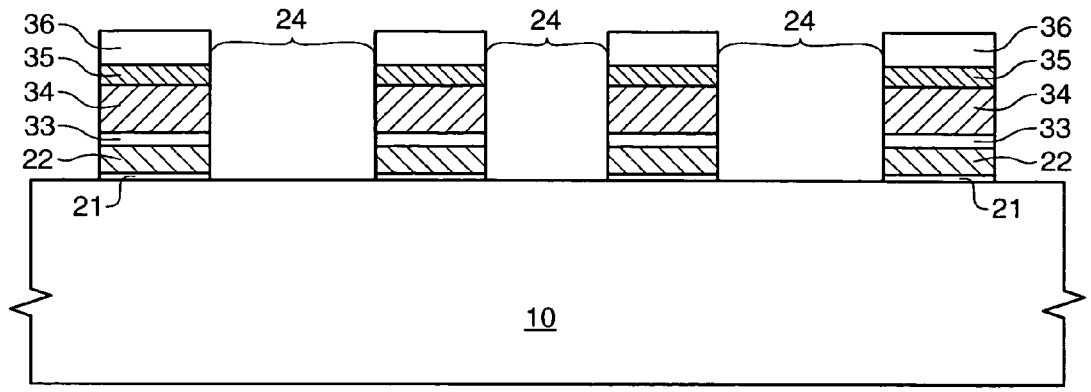
FIG. 3 is a cross-sectional view taken through line 2–2' of FIG. 1 after the formation of a transistor gate stack for a floating gate device.

FIG. 3 is a cross-sectional view of FIG. 1 taken through line 2–2'. Referring now to FIG. 3, various materials have been deposited and etched to form the transistor gate for each floating gate device. The transistor gate comprises tunnel oxide 21, a floating gate 22, an inter-polysilicon dielectric (such as an oxide/nitride/oxide stack) 33, polysilicon wordline 34, which is typically capped with tungsten silicide 35 and an oxide or nitride cap 36. It is preferred that a dielectric possessing a high dielectric constant of 3 or greater, such as $Al_2O_3$ be used for inter-polysilicon dielectric 33. FIG. 3 also shows the locations of active areas 24.

Figure 4:
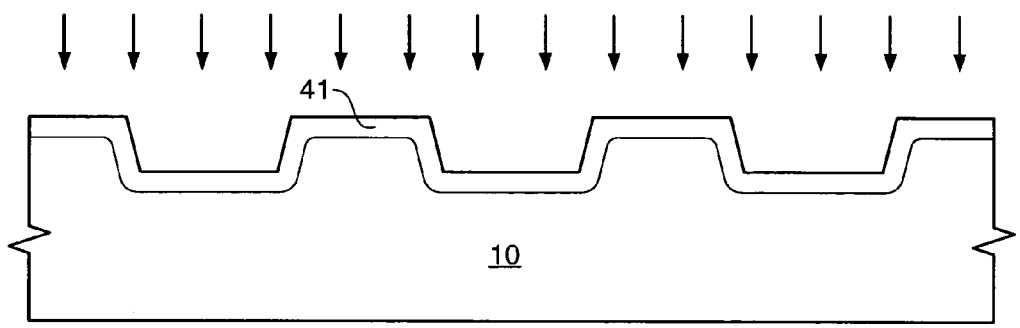
FIG. 4 is a cross-sectional view taken through line 3–3' of FIG. 1 after the removal of the shallow trench isolation oxide and an arsenic and/or phosphorous source implant.

FIG. 4 is a cross-sectional view taken through line 3–3' of FIG. 1. Referring now to FIG. 4, an etch (defined as a self-aligned source etch or SAS etch) is performed to remove shallow trench isolation oxide 26 (not seen).

Figure 5:
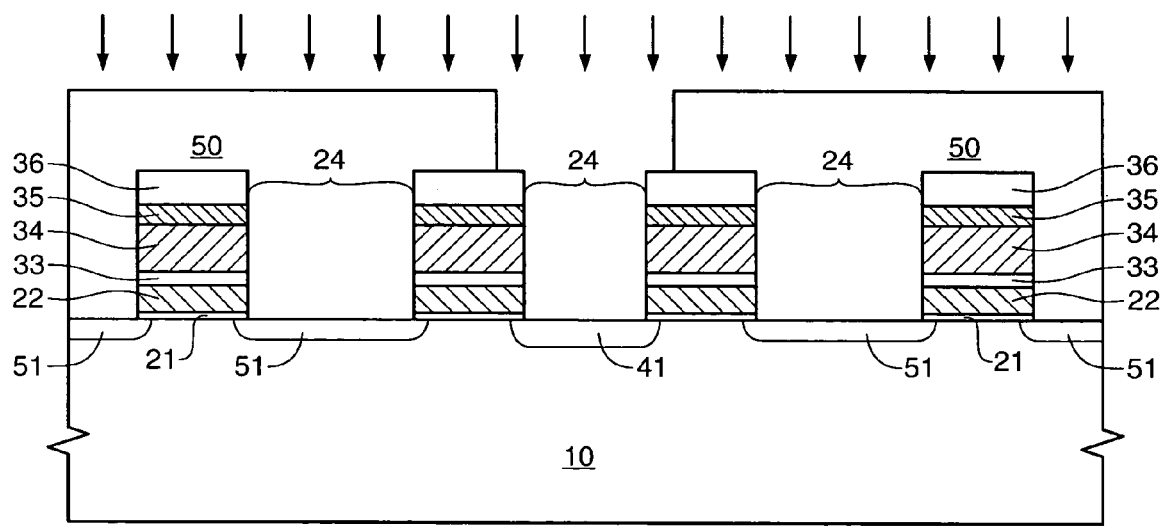
FIG. 5 is a cross-sectional view following the cross-sectional view of FIG. 3 taken after an arsenic and/or phosphorous source implant, followed by an arsenic and/or phosphorous source/drain blanket implant.

FIG. 5 follows the view of FIG. 3. As seen in FIG. 5, photoresist 50 is patterned and etched to expose underlying silicon 10 prior to a subsequent source implant. Referring now to both FIGS. 4 and 5, an arsenic and/or phosphorous source implant (also defined as a self-aligned source implant or SAS implant) is performed to form self-aligned source region 41, (shown in both FIGS. 4 and 5). Next, photoresist 50 is stripped and a blanket arsenic and/or phosphorous source/drain implant is performed which simultaneously forms drain regions 51 while also increasing the doping of the source region 41.

It is optional to eliminate both the SAS etch and the SAS implant and rely on the above mentioned subsequent source/drain implant to form the source and drain conductive regions. If the SAS etch is eliminated, trenches 25 would still contain oxide 26 (as seen in FIG. 2C). If the SAS implant is eliminated, a conventional array oxidation need not be performed, nor would array source/drain implant drive be necessary.

Figure 6:
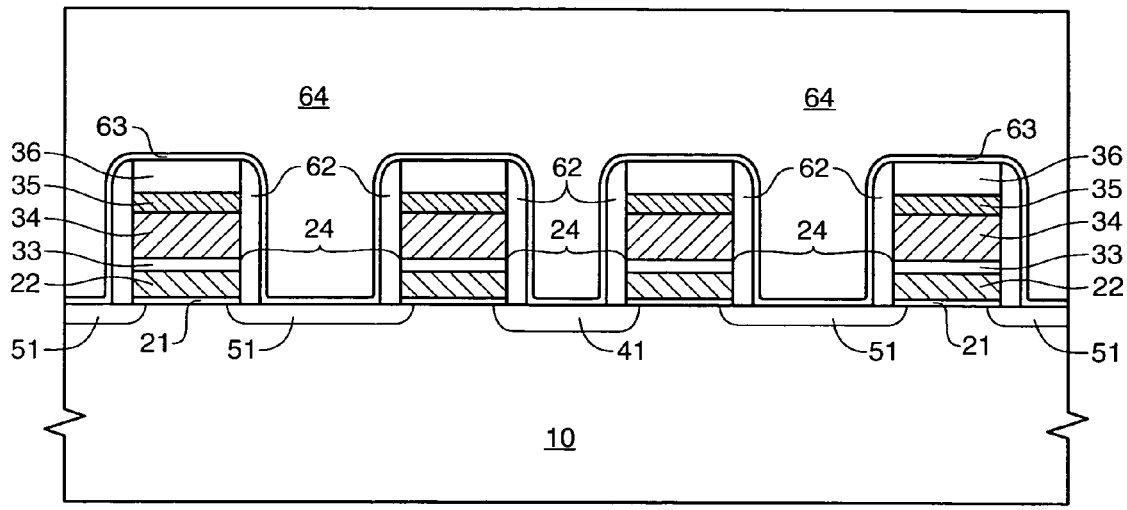
FIG. 6 is a cross-sectional view following the cross-sectional view of FIG. 5 taken after the formation of drain implants, transistor gate cap and spacers, followed by the deposition of a conformal layer of nitride and the formation of a planarized borophosphosilicate glass (BPSG) isolation layer.

FIG. 6 follows the view of FIG. 5. Referring now to FIG. 6, transistor isolation spacers 62 are formed. In the present invention, nitride or an oxynitride film is used in order to take advantage of the etch selectivity to oxide. Even though nitride is known to exert more stress than will oxide on underlying structures and possibly cause electrical changes, nitride is an effective etch stop material to use during the subsequently performed self-aligned contact etch. Following the formation of spacers 62, a conformal nitride etch stop barrier layer 63 is deposited which will cover source/drain regions 41 and 51 as well as cap 36 and spacers 62.

Nitride layer 63 will function as both an etch stop layer as well as a barrier layer if spacers 62 and caps 36 are formed from oxide. As a barrier layer, nitride layer 63 will prevent the diffusion of dopant atoms into any exposed active areas, such as the source and drain regions. Specifically, nitride layer 63 will prevent boron and phosphorous atoms from diffusing from a subsequently deposited BPSG layer into the underlying active areas, such as source region 41 and drain regions 51. Prior to the formation of barrier layer 63, an optional wet etch may be performed in order to ensure that spacers 62 are etched back sufficiently to allow subsequently formed metal (used to form the source and drain interconnects) adequately fill the self-aligned source via openings and the self-aligned drain via openings that are etched later in the process. Then the structure is covered with BPSG material 64 that is also planarized.

Figure 7:
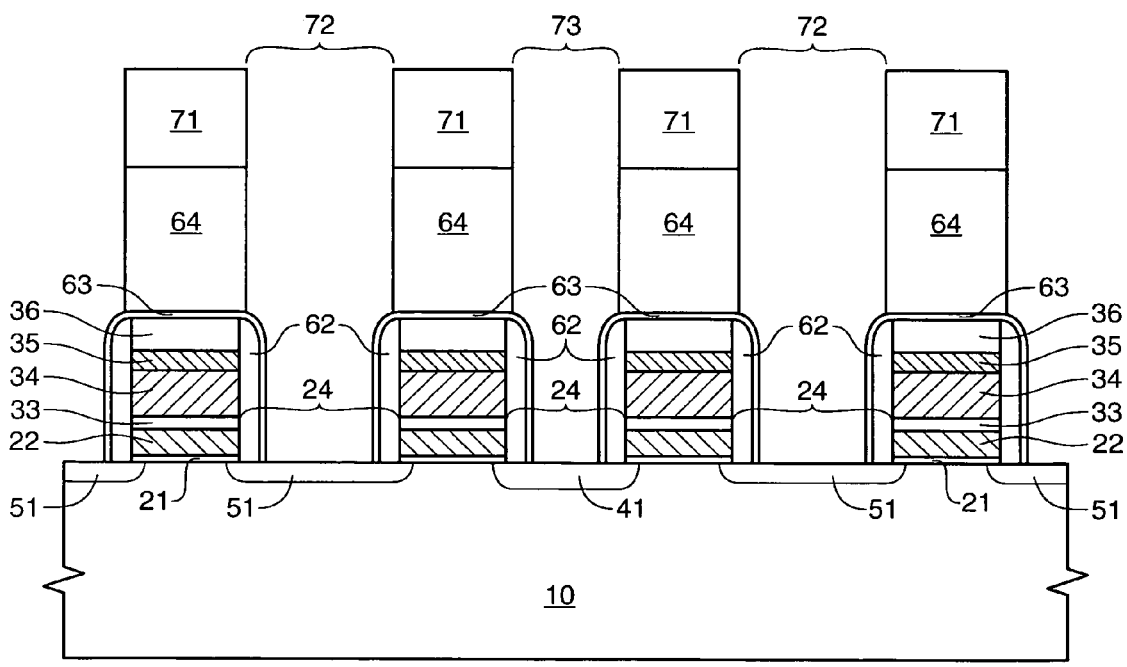
FIG. 7 is a cross-sectional view following the cross-sectional view of FIG. 6 taken after the patterning and etching of contact via opening to expose the source and drain of the floating gate device.

Referring now to FIG. 7, BPSG material 64 is patterned with photoresist 71 to allow for a subsequent via etch (also defined as the self-aligned source contact etch or a SAS contact etch) to form drain contact via openings 72 and source line via opening 73. The via etch removes exposed BPSG material 64 and stops on etch stop barrier layer 63. Next, an etch is performed to clear the conformal nitride from the surface of source/drain regions 41 and 51.

Figure 8:
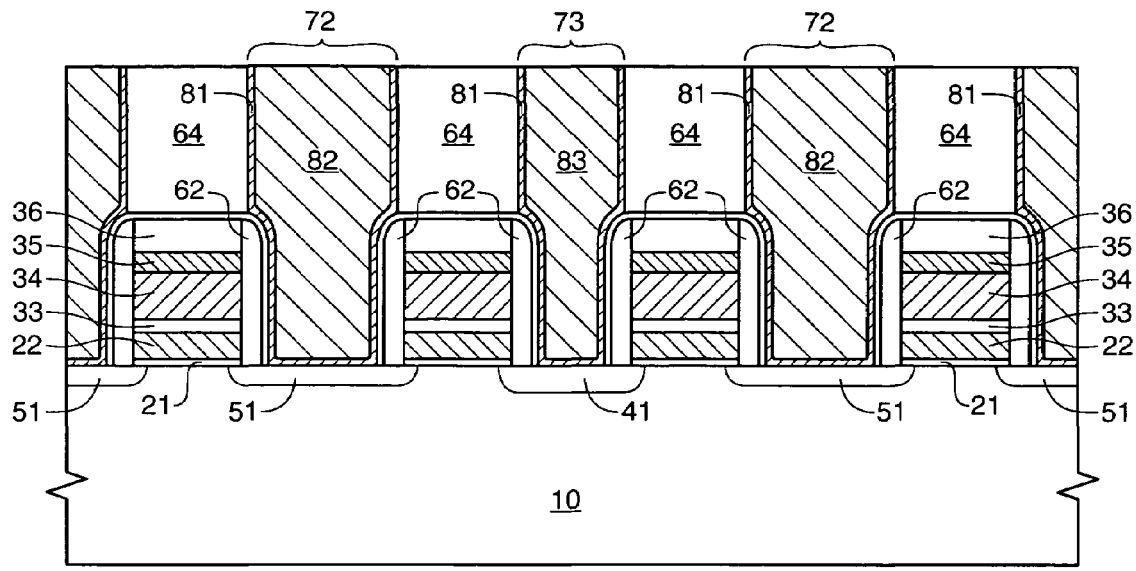
FIG. 8 is a cross-sectional view following the cross-sectional view of FIG. 7 taken after the formation of a planarized layer of tungsten/titanium to create self-aligned drain contact plugs and to create a tungsten/titanium local interconnect between each source.

Referring now to FIG. 8, photoresist 71 (seen in FIG. 7) is stripped and a conformal titanium nitride barrier layer 81 is deposited along the edges of via openings 72 and 73. Next, a metal such as a tungsten-based metal (solely tungsten or titanium tungsten) is formed to fill drain contact via openings 72 and source line opening 73. The metal is then planarized to form self-aligned drain contacts 82 (or plugs 82) and local interconnect 83 that is self-aligned to source 41. Drain contact plugs 82 will subsequently become connected between the drain of selected floating gate devices and a digit line.

Figure 9:
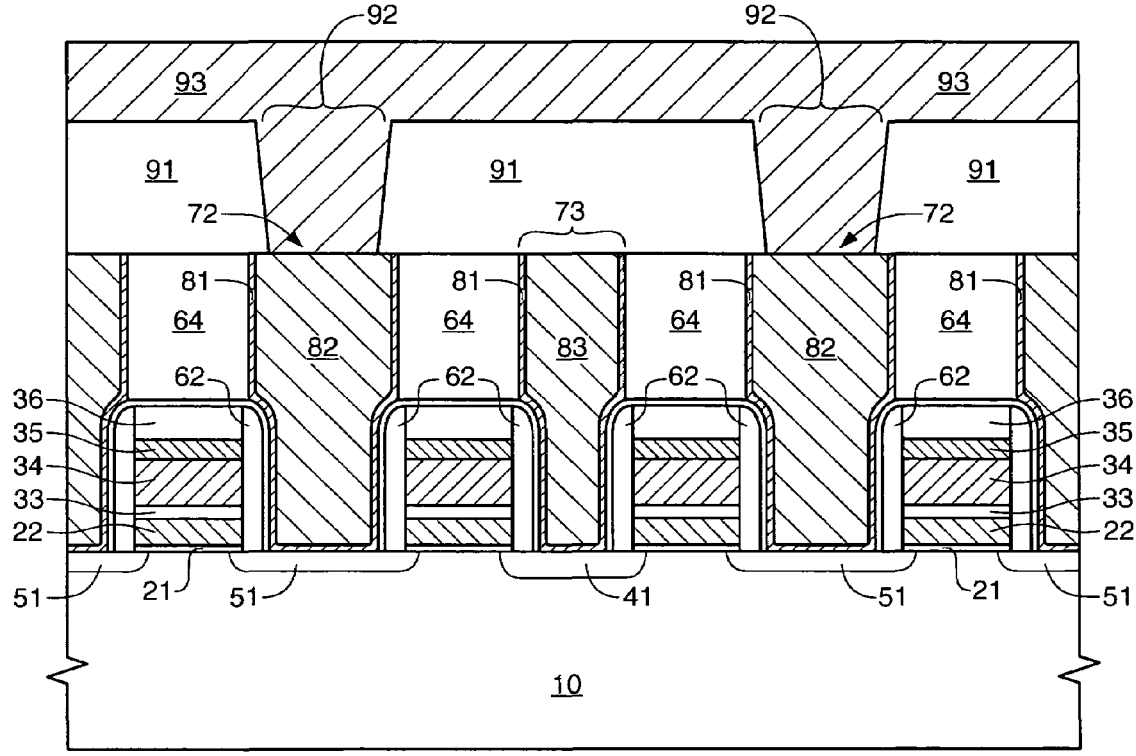
FIG. 9 is a cross-sectional view following the cross-sectional view of FIG. 8 taken after the formation of a planarized layer of inner layer dielectric material that is patterned and etched to provide via openings to expose the drain contact plugs which is followed by the formation of a planarized metal to make interconnects between the self-aligned drain plugs.

Referring now to FIG. 9, an inner layer dielectric material 91 is formed over the present structure of FIG. 8. Dielectric material 91 is planarized and then patterned and etched to form via openings 92 that expose underlying drain contact plugs 82. Next a metal 93 is formed that fills via openings 92. Metal 93 is planarized and serves as a digit line for the selected floating gate devices.

Figure 10:
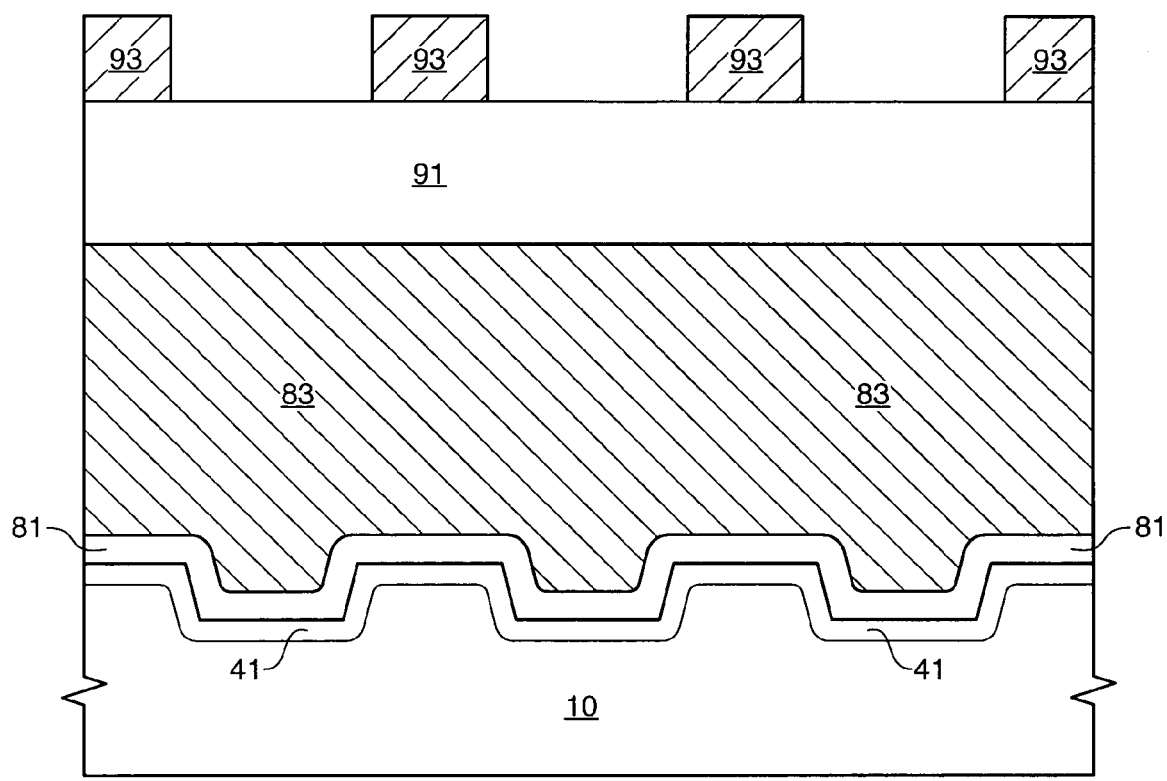
FIG. 10 is a cross-sectional view following the cross-sectional view of FIG. 4 taken after the formation of a planarized layer of tungsten/titanium to create a tungsten/titanium local interconnect between each source.

FIG. 10 is a cross-sectional view taken along the self-aligned source 41 of FIG. 1. Referring now to FIG. 10, local interconnect 83 makes connection to each source of a series of devices that are inner-connected by the self-aligned source implant. Important elements of the present invention are the combination of using metal local interconnect 83 with the self-aligned source 41, in conjunction with self-aligned drain contacts 82 (not seen in FIG. 10) that significantly lower source resistance and also allow the fabrication of a smaller floating gate device. The self-aligned source allows for a smaller cell simply by its inherent nature of being self-aligned to the transistor gate of each floating gate device. The lowered source resistance, due to the presence of the metal local interconnect, gives better cell performance uniformity when comparing the performance of a cell that is relatively close to a source contact versus a cell fairly far away from a source contact.

By employing the metal local interconnect, the overall size of the array can be reduced, as fewer source contacts will be needed compared to a conventional flash cell array. Most importantly, the metal local interconnect 83 connecting from source to source of series of devices will significantly reduce source resistance as the metal (such as a tungsten-based metal) provides a much better conducting line than does the conductively doped active area that forms the source for each device.

As demonstrated by the teachings of the present invention, the addition of a tungsten/titanium local interconnect to the source electrode, a self-aligned floating gate and a tungsten/titanium self-aligned drain electrode contact can be efficiently incorporated into conventional flash memory device fabrication methods.

It is to be understood that although the present invention has been described with reference to several preferred embodiments, various modifications, known to those skilled in the art, may be made to the process steps presented herein without departing from the invention as recited in the several claims appended hereto.

What is claimed is:

1. A method for forming a floating gate memory array comprising:
    forming a gate dielectric layer on a substrate, wherein the substrate extends horizontally in perpendicular X and Y directions;
    forming a floating gate material layer on the gate dielectric layer;
    forming a disposable material layer on the floating gate material layer;
    etching column strips in the Y direction through the disposable material layer, floating gate material layer and the gate dielectric layer to form isolation trenches into the substrate which extend longitudinally in the Y direction;
    forming an insulator material to a vertical height above the disposable material layer;
    planarizing the insulator material to expose a top region of the disposable material layer;
    removing the disposable material layer to expose a top region of the floating gate material layer, wherein the top region of the floating gate material layer is recessed below a top surface of the planarized insulator material;
    forming layers of an intermediate dielectric, a conductive wordline, a tungsten silicide and an insulation cap;
    etching row strips in the X direction through the floating gate material layer to a depth of at least the gate dielectric layer to define transistor gates;
    performing a source implant to form rows of source regions in the substrate extending in the X direction in alternate ones of the row strips;
    performing a source/drain implant to simultaneously form drain regions unique to a respective transistor while increasing a doping of the rows of source regions;
    forming dielectric transistor gate spacers;
    forming a conformal etch stop barrier layer over the transistor gates, the gate spacers, the source regions and the drain regions;
    forming a planarized insulation material over the etch stop barrier layer;
    performing a via etch through the planarized insulation material to completely clear the planarized insulation material residing between the transistor gates, thus exposing the etch stop barrier layer and forming rows of source line vias running in the X direction and separate drain vias unique to each transistor running in the Y direction;
    clearing a horizontal component of the conformal etch stop barrier layer that covers the source regions and drain regions; and
    forming individual drain contacts to a respective transistor gate and rows of source contact interconnects, wherein the individual drain contacts and the rows of source contact interconnects substantially fill openings between the transistor gates and abut to a vertical component of the conformal etch stop barrier layer residing on the transistor gates.

2. A method of forming floating gate transistors comprising:
    etching isolation trenches in a Y direction through a layer of floating gate material and tunneling dielectric, wherein the isolation trenches vertically extend into an underlying substrate;
    forming an intermediate dielectric layer and a tungsten comprising control gate material layer on the floating gate material;
    etching the control gate, intermediate dielectric layer, and the floating gate material in an X direction, wherein X is perpendicular to Y, to form individual floating gates from the floating gate material that have defined boundaries in the X and Y directions for individual floating gate transistors, and to form word lines from the control gate material having a defined width in the Y direction and extending in the X direction such that multiple transistors spaced apart in the X direction share a common word line;
    implanting common source regions extending in the X direction such that multiple transistors spaced apart in the X direction share a common source region;
    implanting drain regions such that transistors spaced apart in the X direction do not share a common drain region;
    forming a conformal etch stop barrier layer over the control gates of the common source regions and the drain regions;
    forming a planarized insulation material over the conformal etch stop layer;
    performing a via etch through the planarized insulation material to completely clear the planarized insulation material residing between the control gates and exposing the etch stop barrier layer thereunder;
    clearing a horizontal component of the conformal etch stop barrier layer from the source regions and drain regions; and
    forming rows of source line contacts running in the X direction to form an electrical connection to the common source regions; and
    forming individual drain contacts to the drain regions;
    wherein the rows of source line contacts and the individual drain contacts substantially fill openings between the control gates and abut to a vertical component of the conformal etch stop barrier layer residing on the control gates.

3. A method for forming a flash memory device in a semiconductor assembly, comprising:
   forming an oxide layer, a polysilicon layer and a nitride layer on a silicon substrate;
   patterning to define active areas and columns of trenches running in a y-direction of the silicon substrate;
   etching the nitride layer, the polysilicon layer and the oxide layer to form the columns of trenches therein and to define gates locations thereunder;
   forming oxide to fill the columns of trenches and cover the patterned nitride layer;
   planarizing the oxide to form columns of trench isolation running in the y-direction and exposing the patterned nitride layer;
   removing the patterned nitride layer to expose the patterned polysilicon layer;
   forming transistor gates running in an x-direction of the silicon substrate, the transistor gates comprising the patterned oxide, the patterned polysilicon layer, a tunnel oxide, a floating gate, an inter-polysilicon dielectric, a polysilicon wordline, a tungsten silicide and an insulation cap;
   etching portions of the trench isolation to form rows of exposed silicon substrate running in the x-direction;
   implanting to form rows of source regions self-aligned to the transistor gates, each source region in a common row being connected together;
   implanting to simultaneously form separate drain regions unique to a respective transistor while doping the source regions;
   forming dielectric spacers on the transistor gates;
   forming a conformal barrier layer over the transistor gates, the dielectric spacers, the source regions and drain regions;
   forming a planarized insulation material over the barrier layer;
   performing a via etch through the planarized insulation material to completely clear the planarized insulation material residing between the transistor gates lined with the conformal barrier layer,
   etching to expose an underlying conformal barrier layer and to simultaneously form rows of source line vias running in the x-direction and separate drain vias unique to each transistor;
   etching to remove a horizontal component of the exposed underlying barrier layer from the surface of the source regions and drain regions;
   forming a titanium nitride layer into the source and drain vias to make contact with the source regions and drain regions such that the titanium nitride layer abuts to a vertical component of the conformal barrier layer lining the transistor gates;
   forming a tungsten-based metal into the source and drain vias thus making contact with the titanium nitride layer; and
   planarizing the tungsten-based metal and the titanium nitride layer to simultaneously form individual drain contacts self-aligned to a respective transistor gate and rows of source interconnects, each row of source interconnects running a major length and major width of a respective underlying row of commonly connected source regions and making substantially continuous contact therebetween.

4. The method of claim 3, wherein said tungsten-based metal comprises titanium/tungsten.

5. A method for forming a flash memory device in a semiconductor assembly, comprising:
   on a silicon substrate and along a y-axis thereof, forming device isolation separated by material to define gate locations thereunder;
   forming transistor gates at the gate locations;
   removing the device isolation to expose the underlying silicon substrate at source locations running along an x-axis of the silicon substrate, the removal of the device isolation forming source locations self-aligned to the transistor gates;
   implanting into the exposed underlying silicon substrate to form source regions self-aligned to the transistor gates and commonly connected together in a row along the x-axis;
   implanting to simultaneously form drain regions while increasing the doping of the source regions;
   forming a conformal dielectric material over the transistor gates, the source regions and the drain regions;
   forming a planarized insulation material over the conformal dielectric layer;
   performing a via etch through the planarized insulation material to completely clear the planarized insulation material residing between the transistor gates lined with the conformal dielectric material,
   forming source and drain openings in the by clearing a horizontal component of the conformal dielectric material to expose the source regions and the drain regions;
   forming metal into the source and drain via openings to make contact with the source regions and the drain regions such that the metal substantially fills the via openings and abuts to a vertical component of the conformal dielectric material lining the transistor gates; and
   planarizing the metal to simultaneously form individual drain contacts self-aligned to a respective transistor gate and a row of source interconnects, each row of source interconnects running a major length and major width of a respective underlying row of commonly connected together source regions and making substantially continuous contact therebetween.

6. The method of claim 5, wherein said tungsten-based metal comprises titanium/tungsten.

* * * * *